United States Patent
Yamada et al.

(10) Patent No.: US 11,855,653 B2
(45) Date of Patent: Dec. 26, 2023

(54) PHYSICAL QUANTITY DETECTION CIRCUIT, PHYSICAL QUANTITY SENSOR, AND METHOD OF OPERATION OF PHYSICAL QUANTITY DETECTION CIRCUIT

(71) Applicant: Seiko Epson Corporation, Toyko (JP)

(72) Inventors: Hideyuki Yamada, Minowa (JP); Atsushi Tanaka, Minowa (JP)

(73) Assignee: SEIKO EPSON CORPORATION

( * ) Notice: Subject to any disclaimer, the term of this patent is extended or adjusted under 35 U.S.C. 154(b) by 520 days.

(21) Appl. No.: 17/150,105

(22) Filed: Jan. 15, 2021

(65) Prior Publication Data
US 2021/0226645 A1 Jul. 22, 2021

(30) Foreign Application Priority Data
Jan. 17, 2020 (JP) .................................. 2020-005727

(51) Int. Cl.
| | |
|---|---|
| H03M 1/12 | (2006.01) |
| G01C 19/5776 | (2012.01) |
| H03M 1/06 | (2006.01) |
| G01C 19/5614 | (2012.01) |
| G01C 19/5607 | (2012.01) |

(Continued)

(52) U.S. Cl.
CPC ...... *H03M 1/1245* (2013.01); *G01C 19/5607* (2013.01); *G01C 19/5614* (2013.01); *G01C 19/5776* (2013.01); *G01P 15/14* (2013.01); *H03M 1/0626* (2013.01); *H03M 1/468* (2013.01)

(58) Field of Classification Search
CPC .. H03M 1/1245; H03M 1/0626; H03M 1/468; G01C 19/5607; G01C 19/5614; G01C 19/5776; G01P 15/14
See application file for complete search history.

(56) References Cited

U.S. PATENT DOCUMENTS

| | | | |
|---|---|---|---|
| 9,658,065 B2 * | 5/2017 | Tsutsumi | G01C 19/5776 |
| 11,421,992 B2 * | 8/2022 | Murashima | G01C 19/5776 |

(Continued)

FOREIGN PATENT DOCUMENTS

| | | | | |
|---|---|---|---|---|
| CN | 104641561 B | * | 6/2018 | G11C 27/02 |
| JP | 2015115883 A | * | 6/2015 | H01L 23/5226 |

(Continued)

*Primary Examiner* — Ryan D Walsh
(74) *Attorney, Agent, or Firm* — Harness, Dickey & Pierce, P.L.C.

(57) ABSTRACT

A physical quantity detection circuit includes an analog/digital conversion circuit having an input capacitance and sampling an analog signal in the input capacitance to convert the analog signal into a digital signal, a precharge circuit for precharging the input capacitance before the analog/digital conversion circuit sample the analog signal in the input capacitance, a digital arithmetic circuit for performing arithmetic processing to the digital signal, and a reference voltage circuit for supplying a power supply voltage to the precharge circuit and the digital arithmetic circuit, wherein the arithmetic processing start timing and the arithmetic processing end timing of the digital arithmetic circuit are set to the timings avoiding the precharge period in which the precharge circuit precharges the input capacitance.

8 Claims, 11 Drawing Sheets

(51) Int. Cl.
 *G01P 15/14* (2013.01)
 *H03M 1/46* (2006.01)

(56) References Cited

U.S. PATENT DOCUMENTS

| | | | |
|---|---|---|---|
| 11,650,056 B2* | 5/2023 | Yamada | G01C 19/5614 |
| | | | 702/96 |
| 2016/0269011 A1 | 9/2016 | Uehara et al. | |
| 2017/0276694 A1* | 9/2017 | Uehara | G05F 3/02 |
| 2018/0019717 A1* | 1/2018 | Murashima | H03G 3/20 |
| 2021/0285769 A1* | 9/2021 | Tanaka | G01C 19/5776 |
| 2021/0364543 A1* | 11/2021 | Murashima | G01C 19/5649 |

FOREIGN PATENT DOCUMENTS

| | | |
|---|---|---|
| JP | 2016-171493 A | 9/2016 |
| JP | 2018-166272 A | 10/2018 |

\* cited by examiner

PHYSICAL QUANTITY DETECTION CIRCUIT, PHYSICAL QUANTITY SENSOR, AND METHOD OF OPERATION OF PHYSICAL QUANTITY DETECTION CIRCUIT

The present application is based on, and claims priority from JP Application Serial Number 2020-005727, filed Jan. 17, 2020, the disclosure of which is hereby incorporated by reference herein in its entirety.

BACKGROUND

1. Technical Field

The present disclosure relates to a physical quantity detection circuit, a physical quantity sensor, and a method of operation of a physical quantity detection circuit.

2. Related Art

At present, in a variety of systems and electronic apparatuses, there are widely used a variety of physical quantity sensors capable of detecting a physical quantity such as a gyro sensor for detecting angular velocity and an acceleration sensor for detecting acceleration. In recent years, in particular, in order to construct a system high in reliability, there is used a physical quantity sensor for outputting detection information of a physical quantity as digital data high in noise immunity.

In JP-A-2016-171493 (Document 1), there is described a circuit device which is applied to a gyro sensor and so on, and which is provided with a passive filter to which a detection signal from a sensor is input, an A/D conversion circuit for performing the A/D conversion on an output signal of the passive filter, and a DSP section for performing digital processing on an output signal of the A/D conversion circuit, and further provided with a precharge circuit disposed between the passive filter and the A/D conversion circuit.

According to the circuit device described in Document 1, since the output signal of the passive filter is buffered by a buffer circuit to precharge an input capacitance of the A/D conversion circuit before the A/D conversion circuit samples the output signal of the passive filter, it is possible to output a correct digital signal even when the drive power of the passive filter is low.

However, since a power supply voltage fluctuates at a start timing at which a DSP section starts an operation and an end timing at which the DSP section ends the operation, when the precharge period and the start timing or the end timing of the DSP section overlap each other, a fluctuation occurs in the power supply voltage to be applied to the precharge circuit during the precharge period, and thus, the output of the precharge circuit fluctuates. As a result, there is a problem that an output code after converting the precharge output fluctuates, and thus, the A/D conversion accuracy degrades.

SUMMARY

A physical quantity detection circuit includes a passive filter to which a first analog signal based on an output signal of a physical quantity detection element is input, an analog/digital conversion circuit which has an input capacitance, and is configured to sample a second analog signal based on an output signal of the passive filter to convert the second analog signal into a first digital signal, a precharge circuit which is disposed in a signal path between the passive filter and the analog/digital conversion circuit, and is configured to precharge the input capacitance before the analog/digital conversion circuit samples the second analog signal in the input capacitance, a digital arithmetic circuit to which the first digital signal is input, and which is configured to perform arithmetic processing on the first digital signal to output a second digital signal obtained by the arithmetic processing, and a reference voltage circuit configured to supply a power supply voltage to the precharge circuit and the digital arithmetic circuit, wherein an arithmetic processing start timing at which the digital arithmetic circuit starts the arithmetic processing and an arithmetic processing end timing at which the digital arithmetic circuit ends the arithmetic processing are set to timings avoiding a precharge period in which the precharge circuit precharges the input capacitance.

A physical quantity sensor includes the physical quantity detection circuit described above, and the physical quantity detection element.

A method of operation of a physical quantity detection circuit including a passive filter to which a first analog signal based on an output signal of a physical quantity detection element is input, an analog/digital conversion circuit which has an input capacitance, and is configured to sample a second analog signal based on an output signal of the passive filter to convert the second analog signal into a first digital signal, a precharge circuit disposed in a signal path between the passive filter and the analog/digital conversion circuit, and a digital arithmetic circuit to which the first digital signal is input, and which is configured to output a second digital signal, the method including a precharge step of precharging, by the precharge circuit, the input capacitance, a sampling step of sampling, by the analog/digital conversion circuit, the second analog signal in the input capacitance after the precharge step, a conversion step of converting, by the analog/digital conversion circuit, the second analog signal into the first digital signal after the sampling step, and an arithmetic processing step of performing, by the digital arithmetic circuit, arithmetic processing on the first digital signal input to output the second digital signal obtained by the arithmetic processing, wherein an arithmetic processing start timing at which the digital arithmetic circuit starts the arithmetic processing and an arithmetic processing end timing at which the digital arithmetic circuit ends the arithmetic processing are set to timings avoiding a precharge period in which the precharge circuit performs the precharge.

DESCRIPTION OF EXEMPLARY EMBODIMENTS

1. First Embodiment

Some preferred embodiments of the present disclosure will hereinafter be described in detail using the drawings. It should be noted that the embodiments described below do not unreasonably limit the content of the present disclosure as set forth in the appended claims. Further, all of the constituents described below do not necessarily constitute essential configuration conditions of the present disclosure.

The description will hereinafter be presented taking a physical quantity sensor for detecting an angular velocity as a physical quantity, namely an angular velocity sensor, as an example.

1-1. Configuration of Physical Quantity Sensor

Figure 1:
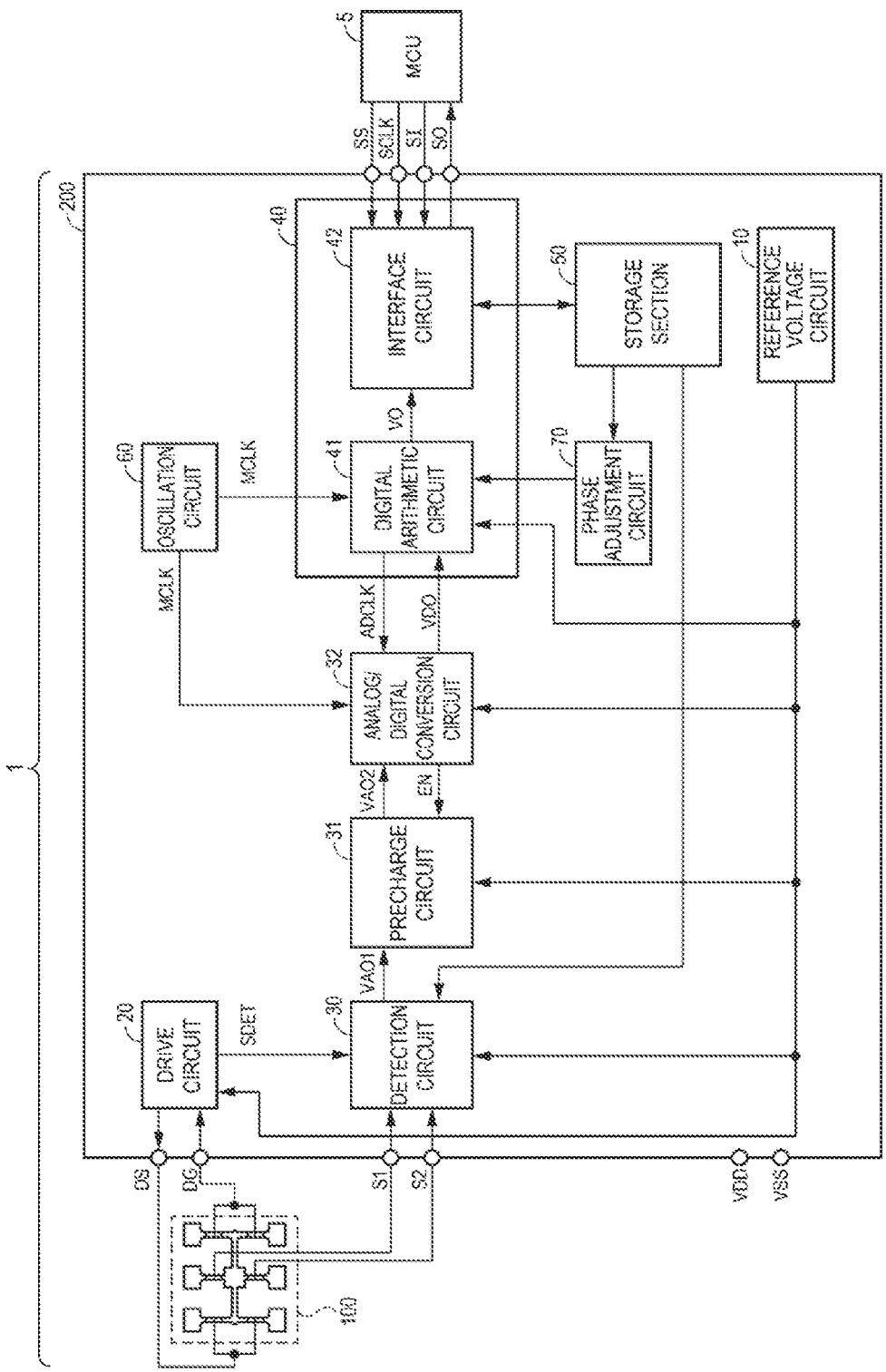
FIG. 1 is a functional block diagram of a physical quantity sensor according to a first embodiment.

FIG. 1 is a functional block diagram of a physical quantity sensor 1 according to the present embodiment. The physical quantity sensor 1 according to the present embodiment is configured including a physical quantity detection element 100 for outputting an analog signal related to the physical quantity, and a physical quantity detection circuit 200.

The physical quantity detection element 100 has a vibrator element provided with drive electrodes and detection electrodes, and in general, in order to make the impedance of the vibrator element as small as possible to increase the oscillation efficiency, the vibrator element is encapsulated in a package in which airtightness is ensured. In the present embodiment, the physical quantity detection element 100 has a so-called double-T type vibrator element having two T-shaped drive vibration arms.

Figure 2:
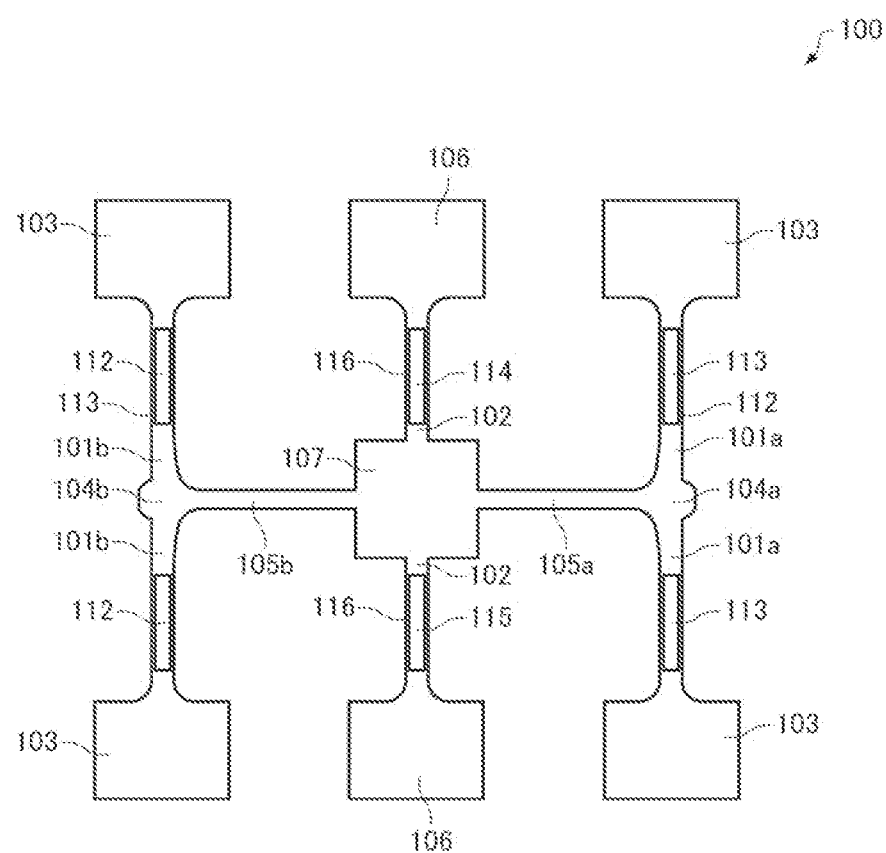
FIG. 2 is a plan view of a vibrator element of a physical quantity detection element.

FIG. 2 is a plan view of the vibrator element of the physical quantity detection element 100 in the present embodiment. The physical quantity detection element 100 has the double-T type vibrator element formed of, for example, a Z-cut quartz crystal substrate. The vibrator element using quartz crystal as the material is extremely small in fluctuation of the resonance frequency with respect to a change in temperature, and therefore, has an advantage that it is possible to increase the detection accuracy of the angular velocity. It should be noted that an X axis, a Y axis, and a Z axis in FIG. 2 represent the axes of the quartz crystal.

As shown in FIG. 2, in the vibrator element of the physical quantity detection element 100, drive vibration arms 101a, 101b extend in the +Y-axis direction and the −Y-axis direction from two driving base parts 104a, 104b, respectively. Drive electrodes 112 and 113 are respectively formed on a side surface and an upper surface of each of the drive vibration arms 101a, and the drive electrode 113 and 112 are respectively formed on a side surface and an upper surface of each of the drive vibration arms 101b. The drive electrodes 112, 113 are coupled to a drive circuit 20 respectively via a DS terminal and a DG terminal of the physical quantity detection circuit 200 shown in FIG. 1.

Driving base parts 104a, 104b are coupled to a detecting base part 107 having a rectangular shape respectively via coupling arms 105a, 105b respectively extending in the −X-axis direction and the +X-axis direction.

Detection vibration arms 102 extend from a detecting base part 107 respectively in the +Y-axis direction and the −Y-axis direction. On the upper surfaces of the detection vibration arms 102, there are respectively formed detection electrodes 114 and 115, and on the side surface of each of the detection vibration arms 102, there is formed a common electrode 116. The detection electrodes 114, 115 are coupled to a detection circuit 30 respectively via an S1 terminal and an S2 terminal of the physical quantity detection circuit 200 shown in FIG. 1. Further, the common electrode 116 is grounded.

Figure 3:
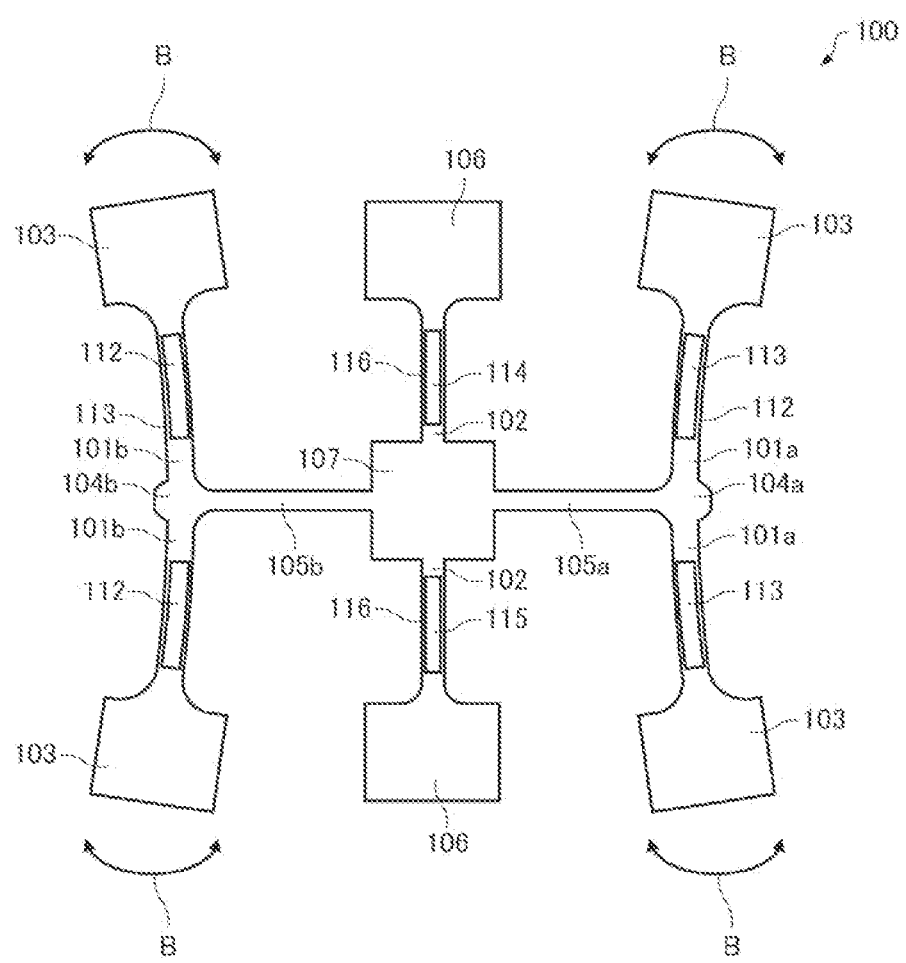
FIG. 3 is a diagram for explaining an action of the physical quantity detection element.

When an AC voltage is applied between the drive electrodes 112 and the drive electrodes 113 of the drive vibration arms 101a, 101b as a drive signal, the drive vibration arms 101a, 101b make flexural vibrations in which the tips of the two drive vibration arms 101a, 101b repeat coming closer to and getting away from each other as indicated by the arrows B due to the inverse piezoelectric effect as shown in FIG. 3. Hereinafter, the flexural vibration of the drive vibration arms 101a, 101b are also referred to as an "excitation vibration" in some cases.

Figure 4:
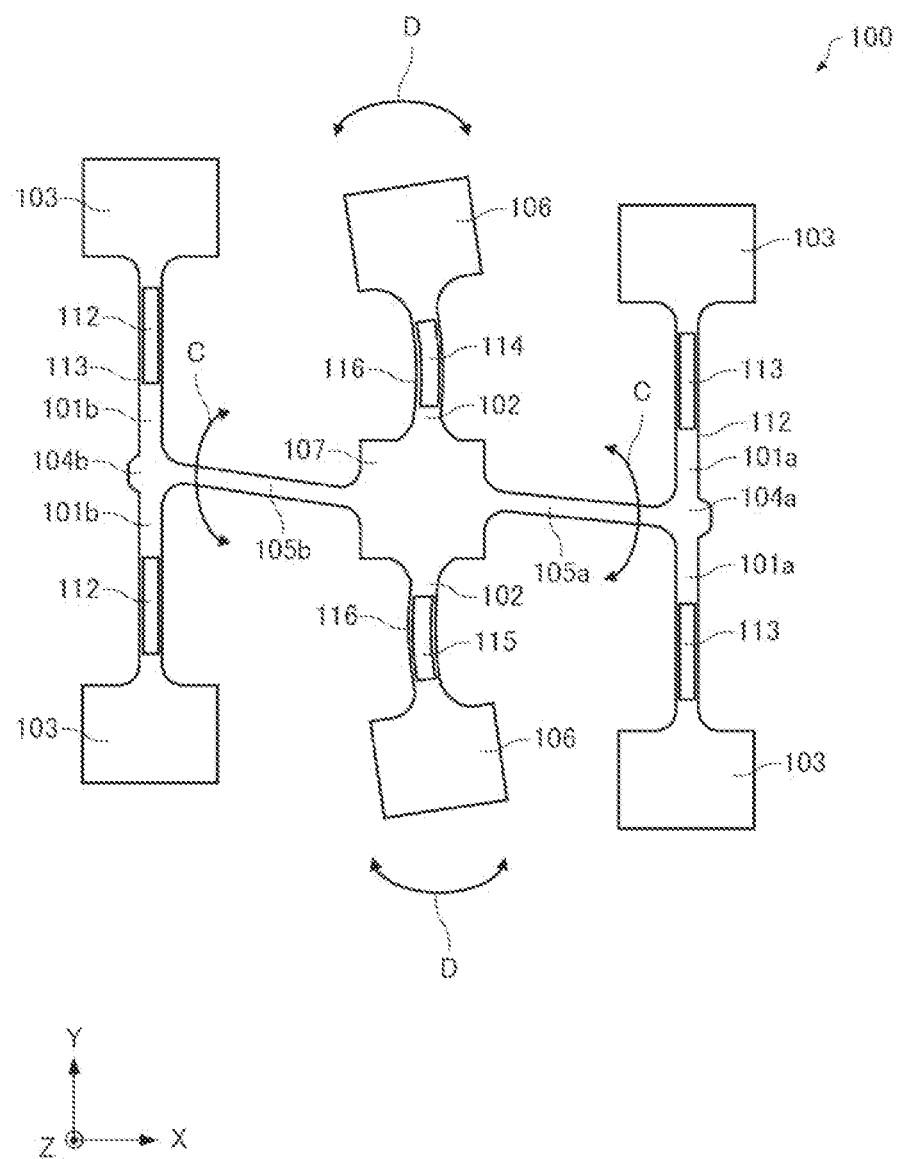
FIG. 4 is a diagram for explaining an action of the physical quantity detection element.

In this state, when an angular velocity around the Z axis as the rotational axis is applied to the vibrator element of the physical quantity detection element 100, the drive vibration arms 101a, 101b each obtain Coriolis force in a direction perpendicular to both of a direction of the flexural vibration indicated by the arrow B and the Z axis. As a result, as shown in FIG. 4, the coupling arms 105a, 105b each make a vibration indicated by the arrow C. Then, the detection vibration arms 102 each make a flexural vibration indicated by the arrow D in tandem with the vibrations of the coupling arms 105a, 105b. The flexural vibrations of the detection vibration arms 102 due to the Coriolis force and the flexural vibrations of the drive vibration arms 101a, 101b are shifted in phase from each other as much as 90°.

Incidentally, when the magnitude of the vibration energy or the amplitude of the vibration when the drive vibration arms 101a, 101b make the flexural vibrations is equal between the two drive vibration arms 101a, 101b, the balance of the vibration energy between the drive vibration arms 101a, 101b is achieved, and in the state in which no angular velocity is applied to the physical quantity detection element 100, the detection vibration arms 102 do not make the flexural vibrations. However, when the balance of the vibration energy between the two drive vibration arms 101a, 101b is lost, the flexural vibrations occur in the detection vibration arms 102 even in the state in which no angular velocity is applied to the physical quantity detection element 100. These flexural vibrations are each called a leakage vibration, and are the flexural vibrations indicated by the arrows D similarly to the vibrations based on the Coriolis force, but are the same in phase as the drive signal.

Further, the AC charges based on these flexural vibrations occur in the detection electrodes 114, 115 of the detection vibration arms 102 due to the piezoelectric effect. Here, the AC charges generated based on the Coriolis force vary in accordance with the magnitude of the Coriolis force, namely the magnitude of the angular velocity, applied to the physical quantity detection element 100. In contrast, the AC charges generated based on the leakage vibrations are constant irrespective of the magnitude of the angular velocity applied to the physical quantity detection element 100.

It should be noted that the tips of the drive vibration arms 101a, 101b are provided with weight parts 103 larger in width than the drive vibration arms 101a, 101b, respectively. By providing each of the tips of the drive vibration arms 101a, 101b with the weight part 103, it is possible to increase the Coriolis force, and at the same time, obtain the desired resonant frequency using a relatively short vibrating arm. Similarly, the tip of the detection vibration arm 102 is provided with a weight part 106 larger in width than the detection vibration arm 102. By providing the tip of each of the detection vibration arms 102 with the weight part 106, it is possible to increase the AC charges generated in the detection electrodes 114, 115.

In such a manner as described above, the physical quantity detection element 100 outputs the AC charges based on the Coriolis force with the Z axis as the detection axis, and the AC charges based on the leakage vibration of the excitation vibration via the detection electrodes 114, 115. This physical quantity detection element 100 functions as an inertial sensor for detecting the angular velocity. Hereinafter, the AC charge based on the Coriolis force is referred to as an "angular velocity component," and the AC charge based on the leakage vibration is referred to as a "vibration leakage component" in some cases.

Going back to the description of FIG. 1, the physical quantity detection circuit 200 includes a reference voltage circuit 10, the drive circuit 20, the detection circuit 30, a precharge circuit 31, an analog/digital conversion circuit 32, a data processing circuit 40, a storage section 50, an oscillation circuit 60, and a phase adjustment circuit 70. The physical quantity detection circuit 200 can be realized by, for example, a single chip integrated circuit. It should be noted that the physical quantity detection circuit 200 can be provided with a configuration obtained by omitting or modifying some of these constituents, or adding other constituents.

The reference voltage circuit 10 generates a constant voltage such as a reference voltage as an analog ground voltage and a constant current based on a power supply voltage vdd and a ground voltage gnd respectively supplied through a VDD terminal and a VSS terminal of the physical quantity detection circuit 200, and then supplies them to the drive circuit 20, the detection circuit 30, the precharge circuit 31, the analog/digital circuit 32, the data processing circuit 40, and so on. The constant voltage supplied by the reference voltage circuit 10 to each of the circuits is an example of the power supply voltage of that circuit.

The drive circuit 20 generates the drive signal for making the physical quantity detection element 100 generate the excitation vibration, and supplies the drive signal to the drive electrode 112 of the physical quantity detection element 100 via the DS terminal. Further, an oscillation current generated in the drive electrode 113 due to the excitation vibration of the physical quantity detection element 100 is input to the drive circuit 20 via the DG terminal, and the drive circuit 20 performs feedback control on the amplitude level of the drive signal so that the amplitude of the oscillation current is kept constant. Further, the drive circuit 20 generates a detection signal SDET the same in phase as the drive signal, and then outputs the detection signal SDET to the detection circuit 30.

The AC charges generated in the two detection electrodes 114, 115 of the physical quantity detection element 100 are input to the detection circuit 30 respectively via the S1 terminal and the S2 terminal of the physical quantity detection circuit 200, and the detection circuit 30 detects an angular velocity component included in these AC charges using the detection signal SDET, and then outputs an analog signal VAO1 corresponding to the magnitude of the angular velocity component to the precharge circuit 31.

The analog signal VAO1 output by the detection circuit 30 is input to the precharge circuit 31, and the precharge circuit 31 outputs an analog signal VAO2 corresponding to the analog signal VAO1 to the analog/digital conversion circuit 32. Further, the precharge circuit 31 precharges the input capacitances of the analog/digital conversion circuit 32.

The analog signal VAO2 is input to the analog/digital conversion circuit 32 from the precharge circuit 31, and the analog/digital conversion circuit 32 converts the analog signal VAO2 into a digital signal VDO having a digital value corresponding to the magnitude of the angular velocity component and then outputs the digital signal VDO. The digital signal VDO is an example of a first digital signal. Further, the analog/digital conversion circuit 32 outputs an enable signal EN designating a precharge period to the precharge circuit 31.

The storage section 50 has a nonvolatile memory not shown, and in the nonvolatile memory, there are stored a variety of types of trimming data with respect to the drive circuit 20 and the detection circuit 30 such as adjustment data and correction data. The nonvolatile memory can be constituted as, for example, an MONOS (Metal Oxide Nitride Oxide Silicon) memory or an EEPROM (Electrically Erasable Programmable Read-Only Memory). Further, the storage section 50 has registers not shown, and can be configured so that the variety of types of trimming data stored in the nonvolatile memory are transmitted to and held in the register when powering on the physical quantity detection circuit 200, namely when the voltage at the VDD terminal rises from 0 V to a desired voltage, and then the variety of types of trimming data held in the registers are supplied to the drive circuit 20 and the detection circuit 30.

The data processing circuit 40 includes a digital arithmetic circuit 41 and an interface circuit 42. The digital arithmetic circuit 41 operates with a master clock signal MCLK. Specifically, the digital arithmetic circuit 41 generates a clock signal ADCLK and then outputs the clock signal ADCLK to the analog/digital conversion circuit 32. Further, the digital arithmetic circuit 41 performs predetermined arithmetic processing on the digital signal VDO input from the analog/digital conversion circuit 32, and then outputs digital data VO obtained by the arithmetic processing. The digital data VO is an example of a second digital signal.

In accordance with requests from an MCU (Micro Control Unit) 5 as an external device of the physical quantity detection circuit 200, the interface circuit 42 performs processing of outputting the digital data VO on which the arithmetic processing has been performed in the digital arithmetic circuit 41 to the MCU 5, processing of retrieving the data stored in the nonvolatile memory or the registers of the storage section 50 and then outputting the data to the MCU 5, processing of writing the data input from the MCU 5 into the nonvolatile memory or the registers of the storage section 50, and so on. The interface circuit 42 is, for example, an interface circuit for an SPI (Serial Parallel Interface) bus, wherein a selection signal, a clock signal, and a data signal are input to the interface circuit 42 respectively via an SS terminal, an SCLK terminal, and an SI terminal of the physical quantity detection circuit 200, and the interface circuit 42 outputs the data signal to the MCU 5 via an SO terminal of the physical quantity detection circuit 200. It should be noted that the interface circuit 42 can be an interface circuit compatible with a plurality of types of bus such as an I²C (Inter-Integrated Circuit) bus besides the SPI bus.

The oscillation circuit 60 generates the master clock signal MCLK, and then output the master clock signal MCLK to the digital arithmetic circuit 41 and the analog/digital conversion circuit 32. The oscillation circuit 60 can be configured as, for example, a ring oscillator or a CR oscillation circuit.

The phase adjustment circuit 70 controls the digital arithmetic circuit 41 to adjust an arithmetic processing start timing at which the digital arithmetic circuit 41 starts the arithmetic processing, and an arithmetic processing end timing at which the digital arithmetic circuit 41 ends the arithmetic processing. The detailed operation of the phase adjustment circuit 70 will be described later.

1-2. Configuration of Drive Circuit

Figure 5:
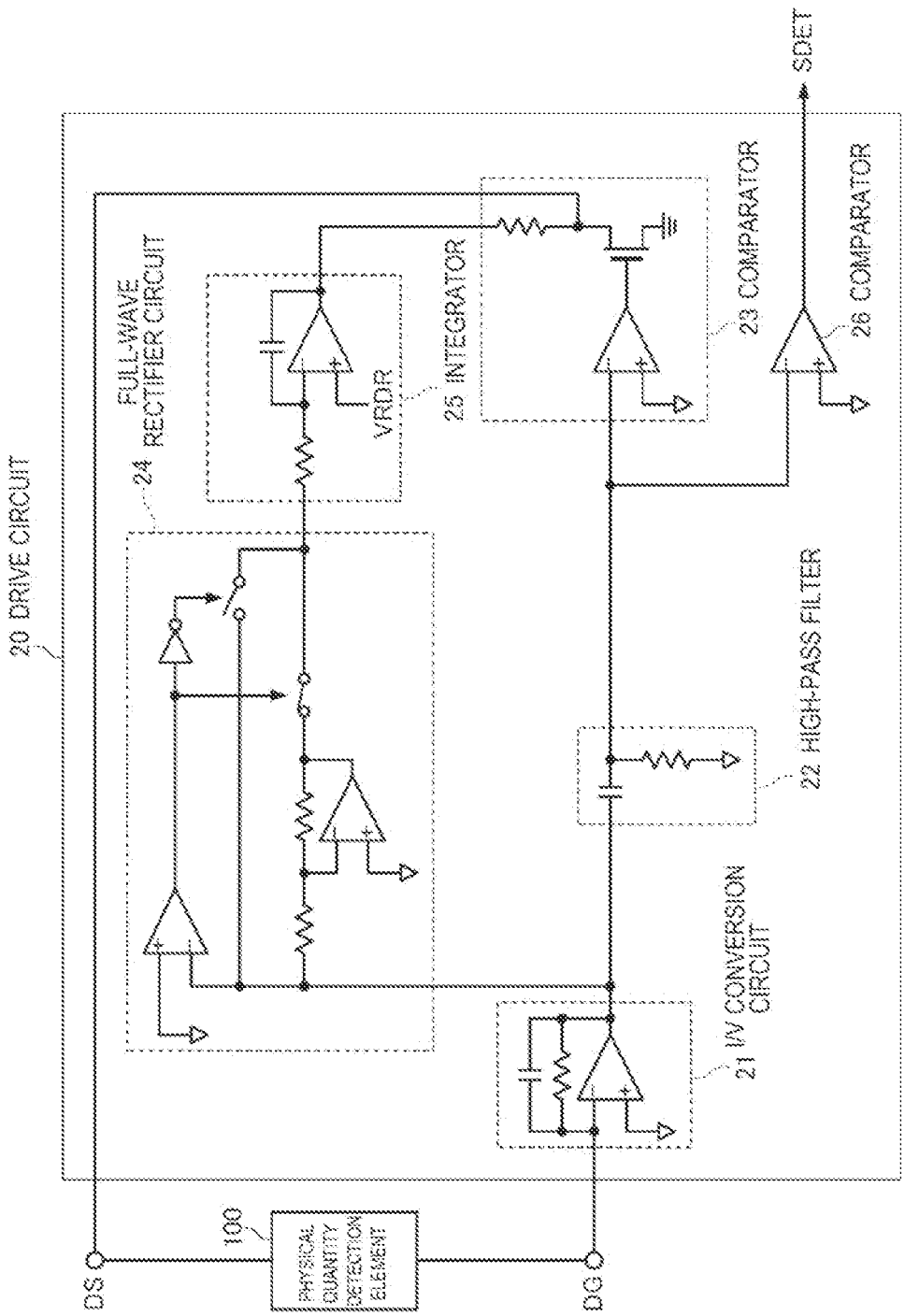
FIG. 5 is a diagram showing a configuration example of a drive circuit.

Then, the drive circuit 20 will be described. FIG. 5 is a diagram showing a configuration example of the drive circuit 20. As shown in FIG. 5, the drive circuit 20 in the present embodiment includes an I/V conversion circuit 21, a high-pass filter 22, a comparator 23, a full-wave rectifier circuit 24, an integrator 25, and a comparator 26. It should be noted that the drive circuit 20 in the present embodiment can have a configuration obtained by eliminating or modifying some of these constituents, or adding other constituents.

The I/V conversion circuit 21 converts the oscillation current which is generated due to the excitation vibration of the physical quantity detection element 100, and is input via the DG element into an AC voltage signal.

The high-pass filter 22 removes offset of an output signal of the I/V conversion circuit 21.

The comparator 23 compares the voltage of the output signal of the high-pass filter 22 with the reference voltage to generate a binarized signal. Then, the comparator 23 sets an NMOS transistor to a conductive state to output a low level when the binarized signal is at a high level, and sets the NMOS transistor to a nonconductive state to thereby output an output voltage of the integrator 25 which is pulled up via a resistor as the high level when the binarized signal is at the low level. The output signal of the comparator 23 is supplied to the physical quantity detection element 100 via the DS terminal as the drive signal. By making the frequency of the drive signal coincide with the resonance frequency of the physical quantity detection element 100, it is possible to make the physical quantity detection element 100 oscillate stably.

The full-wave rectifier circuit 24 outputs a signal converted into a direct current by performing the full-wave rectification on the output signal of the I/V conversion circuit 21.

The integrator 25 integrates the output voltage of the full-wave rectifier circuit 24 based on a desired voltage VRDR supplied from the reference voltage circuit 10, and then outputs the result. The higher the output of the full-wave rectifier circuit 24 is, namely the higher the amplitude of the output signal of the I/V conversion circuit 21 is, the lower the output voltage of the integrator 25 becomes. Therefore, the higher the oscillation amplitude is, the lower the voltage at the high level of the drive signal as the output signal of the comparator 23 becomes, and the lower the oscillation amplitude is, the higher the voltage at the high level of the drive signal becomes, and therefore, automatic gain control (AGC; Auto Gain Control) works so that the oscillation amplitude is kept constant.

The comparator 26 amplifies the voltage of the output signal of the high-pass filter 22 to generate a rectangular wave voltage signal as the binarized signal, and outputs the rectangular wave voltage signal as the detection signal SDET.

Figure 6:
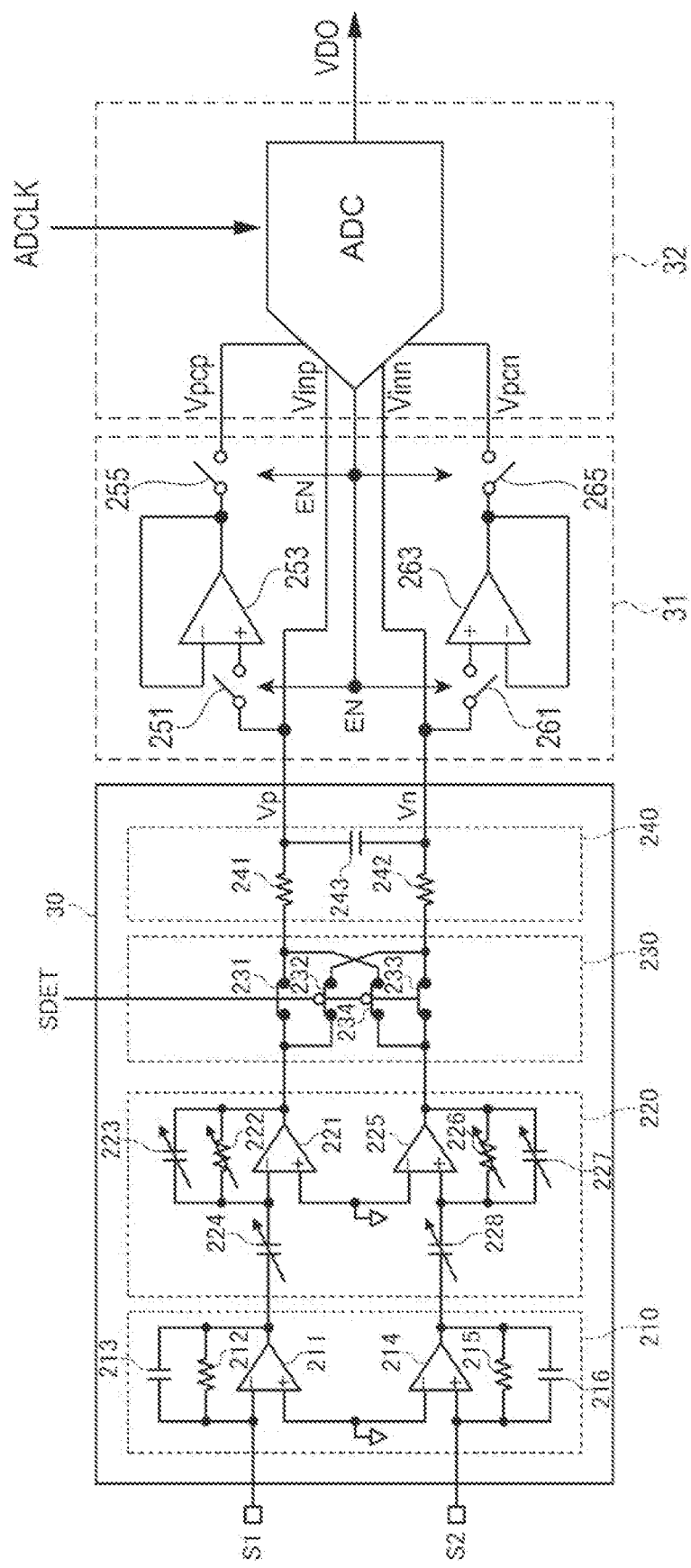
FIG. 6 is a diagram showing a configuration example of a detection circuit, a precharge circuit, and an analog/digital conversion circuit.

1-3. Configurations of Detection Circuit, Precharge Circuit, and Analog/Digital Conversion Circuit Then, the detection circuit 30, the precharge circuit 31, and the analog/digital conversion circuit 32 will be described. FIG. 6 is a diagram showing a configuration example of the detection circuit 30, the precharge circuit 31, and the analog/digital conversion circuit 32. As shown in FIG. 6, the detection circuit 30 in the present embodiment includes a Q-V conversion circuit 210, a variable gain amplifier 220, a mixer 230, and a passive filter 240. It should be noted that the detection circuit 30 in the present embodiment can have a configuration obtained by eliminating or modifying some of these constituents, or adding other constituents.

The Q-V conversion circuit 210 includes an operational amplifier 211, a resistor 212, a capacitor 213, an operational amplifier 214, a resistor 215, and a capacitor 216.

To the operational amplifier 211, there is input an AC charge including the angular velocity component and a vibration leakage component from the detection electrodes 114 of the vibrator element of the physical quantity detection element 100 via the S1 terminal. The resistor 212 is a feedback resistor for the operational amplifier 211. Further, the capacitor 213 is a feedback capacitor for the operational amplifier 211. Similarly, to the operational amplifier 214, there is input an AC charge including the angular velocity component and a vibration leakage component from the detection electrodes 115 of the vibrator element of the physical quantity detection element 100 via the S2 terminal. The resistor 215 is a feedback resistor for the operational amplifier 214. Further, the capacitor 216 is a feedback capacitor for the operational amplifier 214. The AC charge to be input to the operational amplifier 211 and the AC charge to be input to the operational amplifier 214 are different in phase from each other as much as 180°, and the output signal of the operational amplifier 211 and the output signal of the operational amplifier 214 are opposite in phase to each other. The Q-V conversion circuit 210 configured in such a manner converts the AC charges respectively input from the S1 terminal and the S2 terminal into voltage signals to output differential signals opposite in phase to each other. In other words, the Q-V conversion circuit 210 functions as a signal conversion circuit for converting the output signal of the physical quantity detection element 100 into a voltage.

The variable gain amplifier 220 includes an operational amplifier 221, a resistor 222, a capacitor 223, a capacitor 224, an operational amplifier 225, a resistor 226, a capacitor 227, and a capacitor 228. The resistors 222, 226 are variable in resistance, and the capacitors 223, 224, 227, and 228 are variable in capacitance.

To the operational amplifier 221, there is input a signal output from the operational amplifier 211 via the capacitor 224. The resistor 222 is a feedback resistor for the operational amplifier 221. Further, the capacitor 223 is a feedback capacitor for the operational amplifier 221. Similarly, to the operational amplifier 225, there is input a signal output from the operational amplifier 214 via the capacitor 228. The resistor 226 is a feedback resistor for the operational amplifier 225. Further, the capacitor 227 is a feedback capacitor for the operational amplifier 225. The variable gain amplifier 220 configured in such a manner amplifies the differential signals output from the Q-V conversion circuit 210 to output differential signals at desired voltage levels.

The mixer 230 includes a switch 231, a switch 232, a switch 233, and a switch 234.

The switches 231, 233 make conductive when the detection signal SDET output by the drive circuit 20 is at the high level, and make nonconductive when the detection signal SDET is at the low level. Further, the switches 232, 234 make conductive when the detection signal SDET is at the low level, and make nonconductive when the detection signal SDET is at the high level. The mixer 230 outputs the differential signals output from the variable gain amplifier 220 without modification when the detection signal SDET is at the high level, and outputs a signal obtained by inverting the polarity of the differential signals output from the variable gain amplifier 220 when the detection signal SDET is at the low level. The mixer 230 configured in such a manner functions as a detecting circuit which detects the differential signals output from the variable gain amplifier 220 to output differential signals including the angular velocity component using the detection signal SDET. The differential signals output by the mixer 230 are signals at the voltage levels corresponding to the angular velocity applied to the physical quantity detection element 100. It should be noted that the differential signals output from the mixer 230 are an example of a "first analog signal based on the output signal of the physical quantity detection element."

The passive filter 240 includes a resistor 241, a resistor 242, and a capacitor 243. One end of the resistor 241 and one end of the capacitor 243 are coupled to each other, one end of the resistor 242 and the other end of the capacitor 243 are coupled to each other, and the differential signals output from the mixer 230 are input to the other end of the resistor 241 and the other end of the resistor 242. The passive filter 240 configured in such a manner functions as a low-pass filter for outputting the differential signals Vp, Vn obtained by attenuating a high-frequency noise with respect to the differential signals output from the mixer 230. The differential signals Vp, Vn correspond to an analog signal VAO1 shown in FIG. 1. Further, the passive filter 240 also functions as an anti-aliasing filter with respect to the analog/digital conversion circuit 32. The passive filter 240 does not include an active element such as a transistor which generates a 1/f noise, and is therefore lower in output noise than an active filter constituted using an active element, and it becomes possible to improve the S/N ratio of the output signal of the physical quantity sensor 1. It should be noted that the passive filter 240 can be a band-pass filter in accordance with the purpose of the physical quantity sensor 1.

The analog/digital conversion circuit 32 operates based on the master clock signal MCLK and the clock signal ADCLK, and samples the input signals Vinp, Vinn corresponding to the differential signals Vp, Vn in the input capacitances provided to the analog/digital conversion circuit 32 to convert the input signals Vinp, Vinn into a digital signal. It should be noted that the input signals Vinp, Vinn are an example of a "second analog signal based on the output signals of the passive filter," and are the differential signals Vp, Vn output from the passive filter 240 in the example shown in FIG. 6.

The precharge circuit 31 includes a switch 251, an operational amplifier 253, a switch 255, a switch 261, an operational amplifier 263, and a switch 265.

The switches 251, 255, 261, and 265 operate based on the enable signal EN output from the analog/digital conversion circuit 32, make conductive when the enable signal EN is at the high level, and make nonconductive when the enable signal EN is at the low level.

The precharge circuit 31 configured in such a manner is disposed in a signal path between the passive filter 240 and the analog/digital conversion circuit 32, and precharges the input capacitances of the analog/digital conversion circuit 32 using the precharge outputs Vpcp, Vpcn corresponding to the voltage levels of the differential signals Vp, Vn output from the passive filter 240 before the analog/digital conversion circuit 32 samples the input signals Vinp, Vinn in the input capacitances. The input signals Vinp, Vinn correspond to an analog signal VAO2 shown in FIG. 1.

1-4. Configuration of Analog/Digital Conversion Circuit

Figure 7:
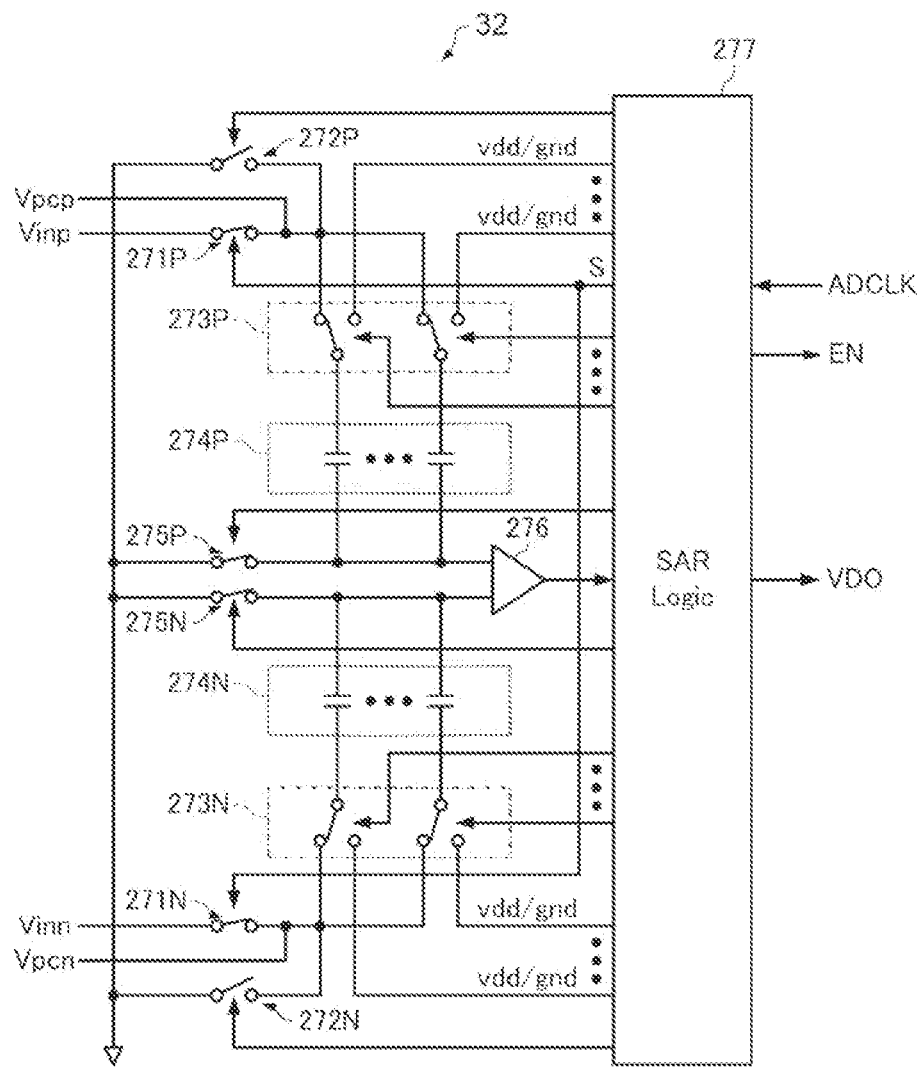
FIG. 7 is a diagram showing a configuration example of the analog/digital conversion circuit.

Then, the analog/digital conversion circuit 32 will be described. In the present embodiment, the analog/digital conversion circuit 32 is a successive-approximation type analog/digital conversion circuit. FIG. 7 is a diagram showing a configuration example of the analog/digital conversion circuit 32. As shown in FIG. 7, the analog/digital conversion circuit 32 in the present embodiment includes a switch 271P, a switch 271N, a switch 272P, a switch 272N, a switch array 273P, a switch array 273N, a capacitance array 274P, a capacitance array 274N, a switch 275P, a switch 275N, a comparator 276, and a logic circuit 277. It should be noted that the analog/digital conversion circuit 32 in the present embodiment can have a configuration obtained by eliminating or modifying some of these constituents, or adding other constituents.

The capacitance array 274P, 274N each have a plurality of capacitors different in capacitance value from each other, and each function as the input capacitance of the analog/digital conversion circuit 32.

The logic circuit 277 controls the operations of the switches 271P, 271N, 272P, 272N, 275P, and 275N, and the switch arrays 273P, 273N based on the clock signal ADCLK input thereto and the enable signal EN output by itself.

Specifically, the logic circuit 277 set a switch control signal S to the low level to control the switches 271P, 271N to make nonconductive, control the switches 272P, 272N to make nonconductive, and control the switches 275P, 275N to make conductive when the enable signal EN output is at the high level. Further, the logic circuit 277 controls the operations of the switch arrays 273P, 273N so that the capacitors of the capacitance arrays 274P, 274N are precharged by the precharge outputs Vpcp, Vpcn.

Then, when the enable signal EN output by the logic circuit 277 changes from the high level to the low level, the logic circuit 277 changes the switch control signal S from the low level to the high level to control the switches 271P, 271N to make conductive to thereby sample the input signals Vinp, Vinn in the capacitors of the capacitance arrays 274P, 274N.

Then, when a predetermined time necessary for performing sampling elapses after changing the switch control signal S from the low level to the high level, the logic circuit 277 changes the switch control signal S from the high level to the low level to control the switches 271P, 271N to make nonconductive, control the switches 272P, 272N to make conductive, and control the switches 275P, 275N to make nonconductive. Further, the logic circuit 277 controls the operations of the switch arrays 273P, 273N so that the capacitors of the capacitance arrays 274P, 274N are coupled to the logic circuit 277. Further, the logic circuit 277 repeats N times the operation of applying the power supply voltage vdd or the ground voltage gnd to the capacitors of the capacitance arrays 274P, 274N in accordance with whether the binarized signal output from the comparator 276 is at the high level or the low level. The logic circuit 277 performs parallel conversion on the binarized signal output from the comparator 276 to generate the digital signal VDO in N bits having a digital value corresponding to a difference in voltage between the input signal Vinp and the input signal Vinn.

As described above, a period in which the enable signal EN is at the high level corresponds to the precharge period, a period in which the switch control signal S is at the high level in a period in which the enable signal EN is at the low level corresponds to a sampling period, and a period in which the switch control signal S and the enable signal EN are both at the low level corresponds to a conversion period.

1-5. Method of Operation of Physical Quantity Detection Circuit

The method of operation of the physical quantity detection circuit 200 includes a precharge process in which the precharge circuit 31 precharges the input capacitances of the analog/digital conversion circuit 32 based on the output signals of the operational amplifiers 253, 263, and a sampling process in which the analog/digital conversion circuit 32 samples the input signals Vinp, Vinn in the input capacitances after the precharge process. Further, the method of operation of the physical quantity detection circuit 200 in the present embodiment includes a conversion process of converting the input signals Vinp, Vinn sampled in the input capacitances into the digital signal VDO after the sampling process, and an arithmetic processing process in which the digital arithmetic circuit 41 performs the arithmetic processing on the digital signal VDO input thereto to output the digital data VO obtained by the arithmetic processing.

Figure 8:
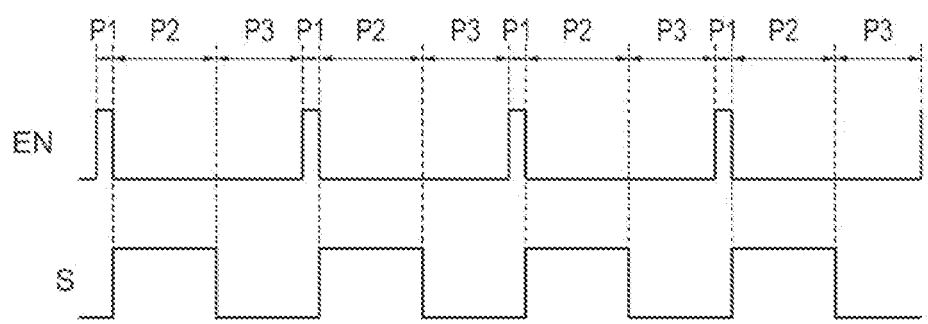
FIG. 8 is a diagram showing a timing chart of an enable signal and a switch control signal.

FIG. 8 is a diagram showing an example of a timing chart of the enable signal EN and the switch control signal S for realizing the method of operation of the physical quantity detection circuit 200. As shown in FIG. 8, in the period P1, the enable signal EN is at the high level, and the switch control signal S is at the low level. The period P1 is the precharge period, and the precharge described above is performed in the period P1.

Figure 9:
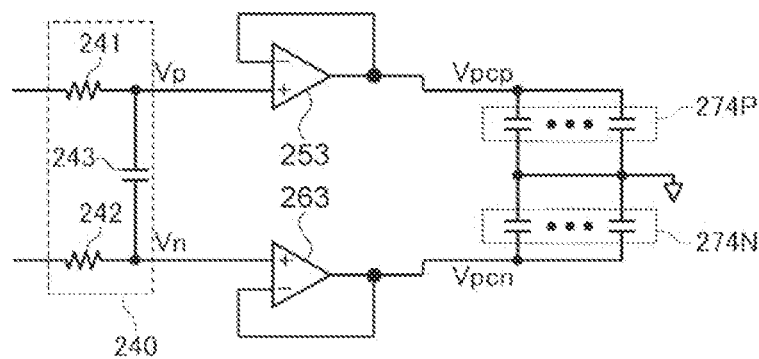
FIG. 9 is a diagram showing a coupling state of a capacitance array in a precharge period.

FIG. 9 is a diagram showing a coupling state of the capacitance arrays 274P, 274N when the enable signal EN is at the high level in the period P1. As shown in FIG. 9, in the period P1, when the enable signal EN is at the high level, the differential signal Vp output from the passive filter 240 is input to the operational amplifier 253, and a signal output from the operational amplifier 253 is supplied to one end of each of capacitors of the capacitance array 274P as the precharge output Vpcp. Further, the differential signal Vn output from the passive filter 240 is input to the operational amplifier 263, and a signal output from the operational amplifier 263 is supplied to one end of each of the capacitors of the capacitance array 274N as the precharge output Vpcn. The other end of each of the capacitors of the capacitance arrays 274P, 274N is supplied with the reference voltage.

Figure 10:
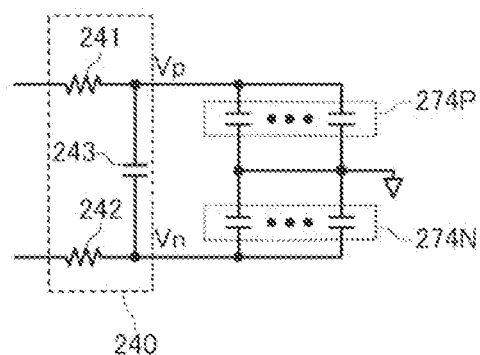
FIG. 10 is a diagram showing the coupling state of the capacitance array in a sampling period.

As shown in FIG. 8, in the period P2, the enable signal EN is at the low level, and the switch control signal S is at the high level. The period P2 is the sampling period, and the sampling described above is performed in the period P2. FIG. 10 is a diagram showing a coupling state of the capacitance arrays 274P, 274N in the period P2. As described in FIG. 10, in the period P2, one end of the capacitors of the capacitance array 274P is supplied with the differential signal Vp output from the passive filter 240. Further, one end of each of the capacitors of the capacitance array 274N is supplied with the differential signal Vn output from the passive filter 240. The other end of each of the capacitors of the capacitance arrays 274P, 274N is supplied with the reference voltage.

Figure 11:
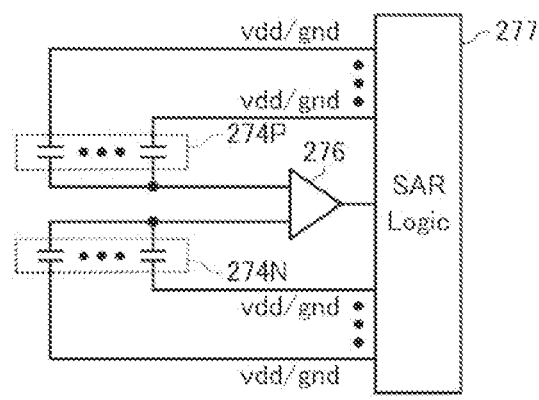
FIG. 11 is a diagram showing the coupling state of the capacitance array in an analog/digital conversion period.

As shown in FIG. 8, in the period P3, the enable signal EN is at the low level, and the switch control signal S is at the low level. The period P3 is the analog/digital conversion period, and the analog/digital conversion described above is performed in the period P3. FIG. 11 is a diagram showing a coupling state of the capacitance arrays 274P, 274N in the period P3. As shown in FIG. 11, in the period P3, one end of each of the capacitors of the capacitance array 274P is supplied with the power supply voltage vdd or the ground voltage gnd from the logic circuit 277, and the other end of each of the capacitors of the capacitance array 274P is coupled to one of the input terminals of the comparator 276. Further, one end of each of the capacitors of the capacitance array 274N is supplied with the power supply voltage vdd or the ground voltage gnd from the logic circuit 277, and the other end of each of the capacitors of the capacitance array 274N is coupled to the other of the input terminals of the comparator 276.

Figure 12:
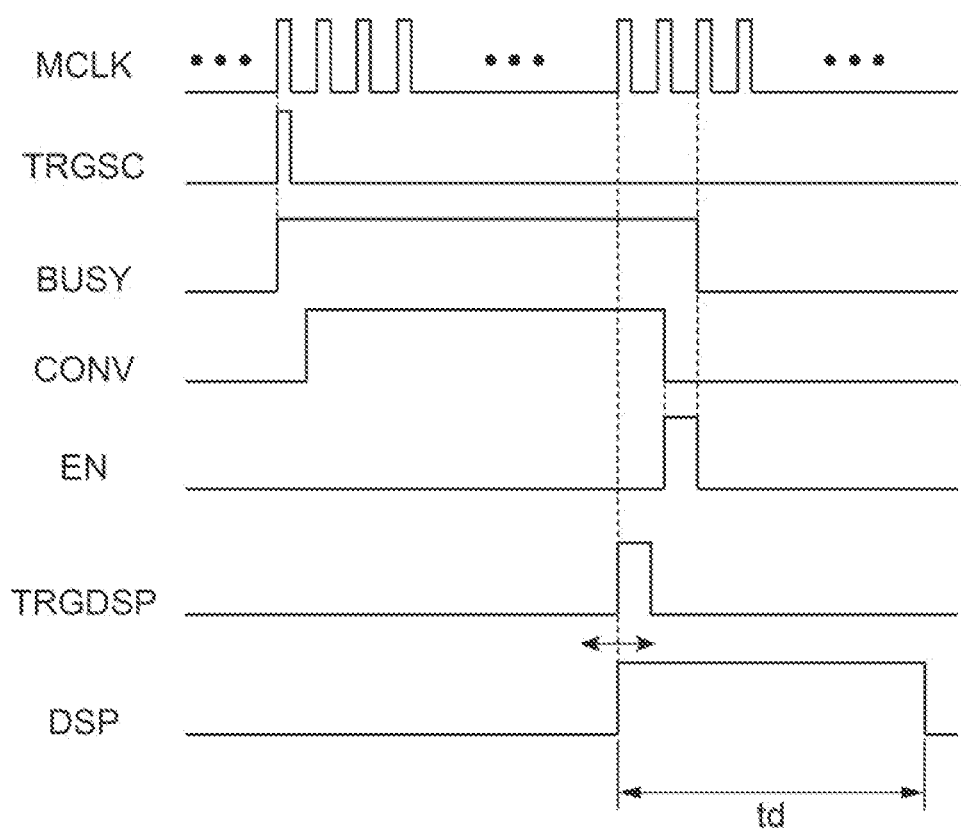
FIG. 12 is a diagram showing an example of a timing chart related to operations of the analog/digital conversion circuit and a digital arithmetic circuit in the first embodiment.

FIG. 12 is a diagram showing an example of a timing chart related to operations of the analog/digital conversion circuit 32 and the digital arithmetic circuit 41. It should be noted that a TRGSC signal, a BUSY signal, and a CONV signal are signals representing the operation state of the analog/digital conversion circuit 32, and a TRGDSP signal and a DSP signal are signals representing the operation state of the digital arithmetic circuit 41.

As shown in FIG. 12, when the master clock signal MCLK generated in the oscillation circuit 60 is input to the analog/digital conversion circuit 32, and the TRGSC signal is temporarily set to the high level in sync with the master clock signal MCLK, the analog/digital conversion circuit 32 starts a basic operation taking the signal as a starting point. Here, the basic operation of the analog/digital conversion circuit 32 means an operation including the analog/digital conversion process and processing performed immediately before and after the analog/digital conversion process. In other words, the period in which the analog/digital conversion circuit 32 performs the basic operation includes the analog/digital conversion period as the period P3, and also includes an end part of the sampling period as the period P2 and the period P1. During the period in which the analog/digital conversion circuit 32 performs the basic operation, the BUSY signal is set to the high level. The period P3, namely the analog/digital conversion period, begins after a predetermined time elapses from when the analog/digital conversion circuit 32 starts the basic operation, and the analog/digital conversion of the analog signal VAO2 which is input via the precharge circuit 31, and corresponds to the level of the input angular velocity is performed. During the period in which the analog/digital conversion is performed, the CONV signal is set to the high level. After the analog/ digital conversion of the analog signal VAO2 is completed, the internal state of the analog/digital conversion circuit 32 is reset, and thus, the basic operation of the analog/digital conversion circuit 32 ends. The period in which the internal state of the analog/digital conversion circuit 32 is reset corresponds to a period from the time point at which the CONV signal changes from the high level to the low level to the time point at which the BUSY signal changes from the high level to the low level. The sampling period as the period P2 begins after the basic operation of the analog/digital conversion circuit 32 ends, and the analog/digital conversion circuit 32 starts the sampling of the analog signal VAO2. During the reset period of the internal state of the analog/digital conversion circuit 32, namely the period from the time point at which the CONV signal changes from the high level to the low level to the time point at which the BUSY signal changes from the high level to the low level, the precharge by the precharge circuit 31 is performed, and during this precharge period, the enable signal EN is set to the high level.

Meanwhile, when the master clock signal MCLK is input to the digital arithmetic circuit 41, and the TRGDSP signal is temporarily set to the high level in sync with the master clock signal MCLK, the operation of the digital arithmetic circuit 41 starts in accordance with that timing. During the period in which the digital arithmetic circuit 41 is in operation, the DSP signal is set to the high level. Then, when the operation of the digital arithmetic circuit 41 ends, the DSP signal is set to the low level.

The phase adjustment circuit 70 is capable of adjusting the arithmetic processing start timing of the digital arithmetic circuit 41, and adjusts the timing at which the TRGDSP signal is set to the high level to thereby adjust the arithmetic processing start timing of the digital arithmetic circuit 41. The adjustment value for adjusting the timing at which the TRGDSP signal is set to the high level is stored in the storage section 50. In the storage section 50, there is stored in advance a plurality of adjustment values different in value from each other, and one of the adjustment values is selected based on an evaluation result before shipment.

The time td from the arithmetic processing start timing to the arithmetic processing end timing in the digital arithmetic circuit 41 is constant, and when the arithmetic processing start timing is adjusted based on adjustment value of the arithmetic processing start timing stored in the storage section 50, the arithmetic processing end timing is also shifted as much as the same period of time as that of the arithmetic processing start timing. Therefore, the adjustment of the arithmetic processing end timing of the digital arithmetic circuit 41 can be achieved by adjusting the arithmetic processing start timing of the digital arithmetic circuit 41.

The phase adjustment circuit 70 retrieves the adjustment value selected based on the evaluation result before shipment from the storage section 50. The phase adjustment circuit 70 adjusts the timing at which the TRGDSP signal is set to the high level based on the adjustment value thus retrieved, and the operation of the digital arithmetic circuit 41 starts in accordance with the TRGDSP signal thus adjusted.

With the phase adjustment circuit 70, by adjusting the timing at which the TRGDSP signal is set to the high level, the arithmetic processing start timing and the arithmetic processing end timing of the digital arithmetic circuit 41 is prevented from overlapping the period in which the enable signal EN is at the high level, namely the precharge period. In other words, the adjustment value with which the arithmetic processing start timing and the arithmetic processing end timing of the digital arithmetic circuit 41 do not overlap the period in which the enable signal EN is at the high level is selected before shipment, and is stored in the storage section 50. This adjustment value is retrieved from the storage section 50 to the phase adjustment circuit 70 when using the physical quantity sensor 1. Thus, the arithmetic processing start timing and the arithmetic processing end timing of the digital arithmetic circuit 41 are set to the timing avoiding the precharge period.

1-6. Functions and Advantages

In the present embodiment, by adjusting the arithmetic processing start timing and the arithmetic processing end timing of the digital arithmetic circuit 41, it is avoided that these timings overlap the precharge period. Therefore, the precharge is not affected by the fluctuation of the power supply voltage due to the start or the end of the operation of the digital arithmetic circuit 41 during the precharge period, and the precharge with stable output becomes possible. Thus, it is possible to suppress the fluctuation of the analog signal VAO2 input to the analog/digital conversion circuit 32 due to the fluctuation of the precharge outputs Vpcp, Vpcn, and it is possible to suppress the fluctuation of the digital signal VDO after the analog/digital conversion. As a result, it is possible to suppress the deterioration of the accuracy of the analog/digital conversion in the analog/digital conversion circuit 32, and it is possible to realize the physical quantity detection circuit 200 high in accuracy.

Further, according to the present embodiment, since the arithmetic processing start timing and the arithmetic processing end timing are adjusted by selecting one of the adjustment values stored in the storage section 50, it is possible to easily perform the adjustment thereof.

1-7. Modified Examples

The input signals to the analog/digital conversion circuit 270 are the differential signals in the embodiment described above, but can also be a single-ended signal. In this case, the differential signals output from the physical quantity detection element 100 are converted into a single-ended signal in any one of the Q-V conversion circuit 210, the variable gain amplifier 220, the mixer 230, and the passive filter 240 of the detection circuit 30. For example, it is possible for the variable gain amplifier 220 to convert the differential signals output from the Q-V conversion circuit 210 into a single-ended signal, and it is possible for the mixer 230, the passive filter 240, and the precharge circuit 31 to perform the processing described above on the single-ended signal.

Further, although in the embodiment described above, the angular velocity sensor including the physical quantity detection element 100 for detecting the angular velocity is cited as an example of the physical quantity sensor 1, the physical quantity to be detected by the physical quantity detection element 100 is not limited to the angular velocity, but can also be angular acceleration, acceleration, velocity, force, and so on. Further, the vibrator element in the physical quantity detection element 100 is not required to be the double-T type, but can also be, for example, a tuning fork type, or a comb-tooth type, or can also be a tuning bar type having a shape such as a triangular prism, a quadrangular prism, or a circular cylindrical shape. Further, as the material of the vibrator element of the physical quantity detection element 100, it is also possible to use a piezoelectric material such as a piezoelectric single crystal such as lithium tantalate ($LiTaO_3$) or lithium niobate ($LiNbO_3$), or a piezoelectric ceramics such as lead zirconate titanate (PZT), or to use a silicon semiconductor instead of quartz crystal ($SiO_2$). Further, it is also possible for the vibrator element in the physical quantity detection element 100 to be provided with a structure in which a piezoelectric thin film such as zinc oxide (ZnO) or aluminum nitride (AlN) sandwiched by drive electrodes is disposed in, for example, a part of the surface of the silicon semiconductor. Further, the physical quantity detection element 100 is not limited to the piezoelectric type element, but can also be an element of an electrodynamic type, a capacitance type, an eddy-current type, an optical type, or a vibration type such as a strain gauge type. For example, the physical quantity detection element 100 can also be an MEMS (Micro Electro Mechanical Systems) vibrator element of the capacitance type. Further, the detection type of the physical quantity detection element 100 is not limited to the vibration type, but can also be, for example, an optical type, a rotary type, or a fluid type.

Further, although in the embodiment described above, the single-axis sensor provided with a single physical quantity detection element 100 is cited as an example of the physical quantity sensor 1, the physical quantity sensor 1 can also be a multiaxial sensor provided with a plurality of physical quantity detection elements 100. For example, the physical quantity sensor 1 can be a three-axis gyro sensor provided with three physical quantity detection elements for detecting angular velocities around three axes different from each other, or can also be a composite sensor provided with the physical quantity detection element for detecting the angular velocity and the physical quantity detection element for detecting the acceleration.

2. Second Embodiment

Figure 13:
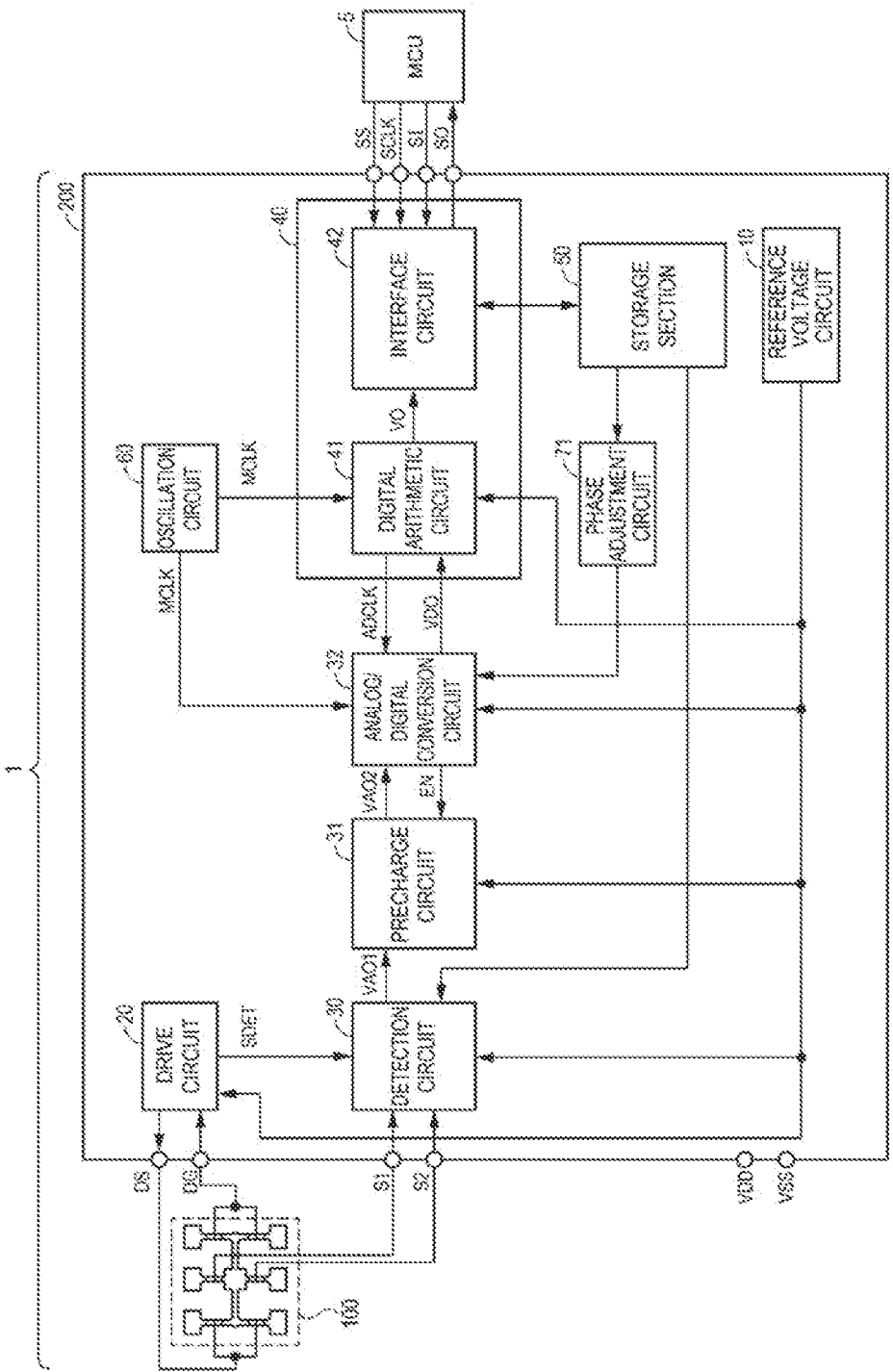
FIG. 13 is a functional block diagram of a physical quantity sensor according to a second embodiment.

FIG. 13 is a functional block diagram of the physical quantity sensor 1 according to a second embodiment.

In the second embodiment, an operation of a phase adjustment circuit 71 is different from the operation of the phase adjustment circuit 70 in the first embodiment. As shown in FIG. 13, the phase adjustment circuit 71 in the present embodiment controls the analog/digital conversion circuit 32 to adjust the precharge period. The rest of the configuration is common to the first embodiment and the second embodiment, and therefore, the description thereof will be omitted.

Figure 14:
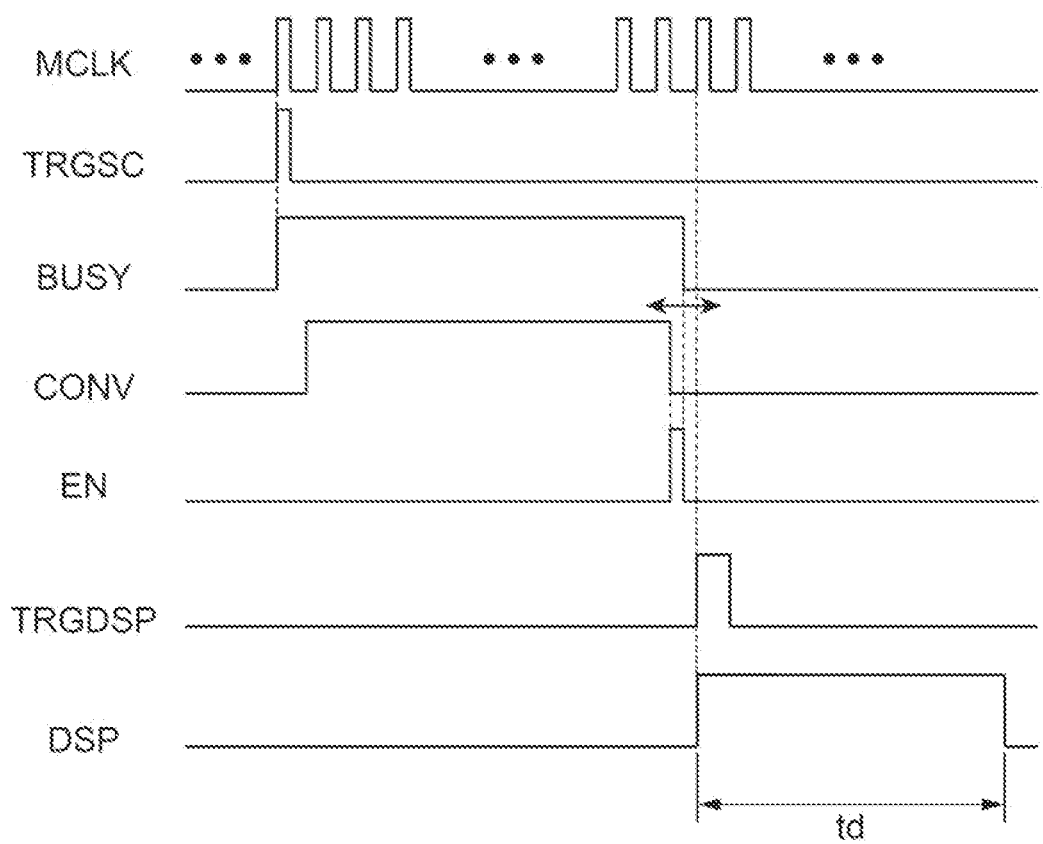
FIG. 14 is a diagram showing an example of a timing chart related to operations of an analog/digital conversion circuit and a digital arithmetic circuit in the second embodiment.

FIG. 14 is a diagram showing an example of a timing chart related to operations of the analog/digital conversion circuit 32 and the digital arithmetic circuit 41 in the second embodiment.

As shown in FIG. 14, the analog/digital conversion of the analog signal VAO2 corresponding to the input angular velocity input via the precharge circuit 31 is performed in substantially the same timing chart as that in the first embodiment.

The phase adjustment circuit 71 in the present embodiment controls the analog/digital conversion circuit 32 to adjust the timing at which the basic operation of the analog/digital conversion circuit 32 ends, namely the timing at which the BUSY signal changes from the high level to the low level while keeping the timing at which the CONV signal changes from the high level to the low level constant. Thus, the period in which the enable signal EN is at the high level, namely the precharge period in which the precharge is performed, is adjusted.

The adjustment value for adjusting the precharge period is stored in the storage section 50. In the storage section 50, there is stored in advance a plurality of adjustment values different in value from each other, and one of the adjustment values is selected based on an evaluation result before shipment.

The selected adjustment value is retrieved from the storage section 50 to the phase adjustment circuit 71. The phase adjustment circuit 71 adjusts the timing at which the BUSY signal changes from the high level to the low level based on the adjustment value thus retrieved to adjust the precharge period.

With the phase adjustment circuit 71, by adjusting the timing at which the BUSY signal changes from the high level to the low level, the precharge period, namely the period in which the enable signal EN is at the high level, is adjusted so as not to overlap the arithmetic processing start timing and the arithmetic processing end timing of the digital arithmetic circuit 41. In other words, the adjustment value with which the period in which the enable signal EN is at the high level does not overlap the arithmetic processing start timing and the arithmetic processing end timing of the digital arithmetic circuit 41 is selected before shipment, and is stored in the storage section 50. This adjustment value is retrieved from the storage section 50 to the phase adjustment circuit 71 when using the physical quantity sensor 1. Thus, the arithmetic processing start timing and the arithmetic processing end timing of the digital arithmetic circuit 41 are prevented from overlapping the precharge period.

It should be noted that as described above, the precharge end timing at which the precharge period ends is synchronized with the sampling start timing at which the analog/digital conversion circuit 32 starts the sampling. Therefore, adjusting the precharge period by the phase adjustment circuit 71 adjusting the timing at which the BUSY signal changes from the high level to the low level is synonymous with adjusting the precharge period by the phase adjustment circuit 71 adjusting the sampling start timing.

According to the present embodiment, the following advantages can be obtained.

In the present embodiment, by adjusting the period in which the enable signal EN is at the high level, namely the precharge period, the precharge period is prevented from overlapping the arithmetic processing start timing and the arithmetic processing end timing of the digital arithmetic circuit 41. Therefore, the precharge is not affected by the fluctuation of the power supply voltage due to the start or the end of the operation of the digital arithmetic circuit 41 during the precharge period, and the precharge with stable output becomes possible. Thus, it is possible to suppress the fluctuation of the analog signal VAO2 input to the analog/digital conversion circuit 32 due to the fluctuation of the precharge outputs Vpcp, Vpcn, and it is possible to suppress the fluctuation of the digital signal VDO after the analog/digital conversion. As a result, it is possible to suppress the deterioration of the accuracy of the analog/digital conversion in the analog/digital conversion circuit 32, and it is possible to realize the physical quantity detection circuit 200 high in accuracy.

The embodiments and the modified example described above are illustrative only, and the present disclosure is not limited to the embodiments and the modified example. For example, it is also possible to arbitrarily combine the embodiments and the modified example described above with each other.

The present disclosure includes configurations substantially the same as the configuration described as the embodiment such as configurations having the same function, the same way, and the same result, or configurations having the same object and the same advantage. Further, the present disclosure includes configurations obtained by replacing a non-essential part of the configurations described as the embodiments. Further, the present disclosure includes configurations providing the same functions and advantages and configurations capable of achieving the same object as those of the configurations described as the embodiments. Further, the present disclosure includes configurations obtained by adding known technologies to the configurations described as the embodiments.

What is claimed is:

1. A physical quantity detection circuit comprising:
a passive filter to which a first analog signal based on an output signal of a physical quantity detection element is input;
an analog/digital conversion circuit which has an input capacitance, and is configured to sample a second analog signal based on an output signal of the passive filter to convert the second analog signal into a first digital signal;
a precharge circuit which is disposed in a signal path between the passive filter and the analog/digital conversion circuit, and is configured to precharge the input capacitance before the analog/digital conversion circuit samples the second analog signal in the input capacitance;
a digital arithmetic circuit to which the first digital signal is input, and which is configured to perform arithmetic processing on the first digital signal to output a second digital signal obtained by the arithmetic processing; and
a reference voltage circuit configured to supply a power supply voltage to the precharge circuit and the digital arithmetic circuit, wherein
an arithmetic processing start timing at which the digital arithmetic circuit starts the arithmetic processing and an arithmetic processing end timing at which the digital arithmetic circuit ends the arithmetic processing are set to timings avoiding a precharge period in which the precharge circuit precharges the input capacitance.

2. The physical quantity detection circuit according to claim 1, further comprising:
a phase adjustment circuit configured to adjust the arithmetic processing start timing and the arithmetic processing end timing.

3. The physical quantity detection circuit according to claim 2, further comprising:
a storage section configured to store a plurality of adjustment values used to adjust the arithmetic processing start timing and the arithmetic processing end timing, wherein
the phase adjustment circuit adjusts the arithmetic processing start timing and the arithmetic processing end timing based on one adjustment value selected from the plurality of adjustment values.

4. The physical quantity detection circuit according to claim 1, further comprising:
a phase adjustment circuit configured to adjust the precharge period.

5. The physical quantity detection circuit according to claim 4, wherein
a precharge end timing at which the precharge period ends is synchronized with a sampling start timing at which the analog/digital conversion circuit starts the sampling, and
the phase adjustment circuit adjusts the sampling start timing to thereby adjust the precharge period.

6. The physical quantity detection circuit according to claim 5, further comprising:
a storage section configured to store a plurality of adjustment values used to adjust the sampling start timing, wherein
the phase adjustment circuit adjusts the sampling start timing based on one adjustment value selected from the plurality of adjustment values.

7. A physical quantity sensor comprising:
the physical quantity detection circuit according to claim 1; and
the physical quantity detection element.

8. A method of operation of a physical quantity detection circuit including
a passive filter to which a first analog signal based on an output signal of a physical quantity detection element is input,
an analog/digital conversion circuit which has an input capacitance, and is configured to sample a second analog signal based on an output signal of the passive filter to convert the second analog signal into a first digital signal,
a precharge circuit disposed in a signal path between the passive filter and the analog/digital conversion circuit, and
a digital arithmetic circuit to which the first digital signal is input, and which is configured to output a second digital signal, the method comprising:
a precharge step of precharging, by the precharge circuit, the input capacitance;
a sampling step of sampling, by the analog/digital conversion circuit, the second analog signal in the input capacitance after the precharge step;
a conversion step of converting, by the analog/digital conversion circuit, the second analog signal into the first digital signal after the sampling step; and
an arithmetic processing step of performing, by the digital arithmetic circuit, arithmetic processing on the first digital signal input to output the second digital signal obtained by the arithmetic processing, wherein
an arithmetic processing start timing at which the digital arithmetic circuit starts the arithmetic processing and an arithmetic processing end timing at which the digital arithmetic circuit ends the arithmetic processing are set to timings avoiding a precharge period in which the precharge circuit performs the precharge.

* * * * *